US009322962B1

(12) United States Patent
Chern et al.

(10) Patent No.: US 9,322,962 B1
(45) Date of Patent: Apr. 26, 2016

(54) STRUCTURED LIGHT GENERATION DEVICE

(71) Applicant: EVERREADY PRECISION IND. CORP., Kaohsiung (TW)

(72) Inventors: Jyh-Long Chern, Taipei (TW); Chih-Ming Yen, New Taipei (TW)

(73) Assignee: EVERREADY PRECISION IND. CORP., Kaohsiung (TW)

( * ) Notice: Subject to any disclaimer, the term of this patent is extended or adjusted under 35 U.S.C. 154(b) by 0 days.

(21) Appl. No.: 14/595,651

(22) Filed: Jan. 13, 2015

(30) Foreign Application Priority Data

Oct. 31, 2014 (TW) ............... 103137850 A
Oct. 31, 2014 (TW) ............... 103137857 A
Oct. 31, 2014 (TW) ............... 103219360 U

(51) Int. Cl.
*G02B 3/04* (2006.01)
*H01S 5/022* (2006.01)
*H01S 3/0941* (2006.01)

(52) U.S. Cl.
CPC ............... *G02B 3/04* (2013.01); *H01S 3/0941* (2013.01); *H01S 5/022* (2013.01)

(58) Field of Classification Search
None
See application file for complete search history.

(56) References Cited

U.S. PATENT DOCUMENTS

| | | | | |
|---|---|---|---|---|
| 4,426,155 A * | 1/1984 | Monchalin | ............... | 356/452 |
| 5,016,149 A * | 5/1991 | Tanaka et al. | ............... | 362/259 |
| 5,313,315 A * | 5/1994 | Feinberg et al. | ............... | 359/4 |
| 5,995,526 A * | 11/1999 | Yan et al. | ............... | 372/37 |
| 6,243,200 B1 * | 6/2001 | Zhou et al. | ............... | 359/484.07 |
| 8,750,671 B1 * | 6/2014 | Kelly et al. | ............... | 385/146 |
| 2003/0080099 A1 * | 5/2003 | Tanaka et al. | ............... | 219/121.73 |
| 2005/0025026 A1 * | 2/2005 | Hirai | ............... | 369/112.02 |
| 2005/0047141 A1 * | 3/2005 | Takezawa | ............... | 362/267 |
| 2006/0055939 A1 * | 3/2006 | Akiba et al. | ............... | 356/497 |
| 2006/0152787 A1 * | 7/2006 | Knebel et al. | ............... | 359/212 |
| 2006/0171035 A1 * | 8/2006 | Berman et al. | ............... | 359/618 |
| 2008/0198389 A1 * | 8/2008 | Yoo et al. | ............... | 356/626 |
| 2009/0207868 A1 * | 8/2009 | Barnes et al. | ............... | 372/20 |
| 2010/0214652 A1 * | 8/2010 | Gollier | ............... | 359/351 |
| 2010/0232806 A1 * | 9/2010 | Kagaya et al. | ............... | 398/183 |
| 2010/0254020 A1 * | 10/2010 | Govyadinov et al. | ............... | 359/641 |
| 2011/0170172 A1 * | 7/2011 | Mizushima et al. | ............... | 359/326 |
| 2011/0261014 A1 * | 10/2011 | Chen et al. | ............... | 345/175 |
| 2011/0291991 A1 * | 12/2011 | Lin | ............... | 345/175 |
| 2013/0077457 A1 * | 3/2013 | Usui et al. | ............... | 369/103 |
| 2014/0168780 A1 * | 6/2014 | Lee et al. | ............... | 359/619 |

* cited by examiner

*Primary Examiner* — Peter Vincent Agustin
(74) *Attorney, Agent, or Firm* — Muncy, Geissler, Olds & Lowe, P.C.

(57) ABSTRACT

A structured light generation device is equipped with a lens unit. The lens unit is installed in a compact housing of the structured light generation device such that it can be workable for two different optical path lengths, and hence for a range of parameter, such as effective focal length, back focal length, or working distance. By the lens unit, an infrared laser spot is collimated into a linear infrared laser beam or specific light pattern if with a free-form type structure formed on a surface where the free form contains diffractive, refractive, and/or reflective optical structures simultaneously or effectively. Consequently, the infrared laser spot is shaped into a structured light for detection or interactive action.

25 Claims, 2 Drawing Sheets

STRUCTURED LIGHT GENERATION DEVICE

FIELD OF THE INVENTION

The present invention relates to a structured light generation device, and more particularly to a structured light generation device for generating an invisible structured light.

BACKGROUND OF THE INVENTION

In recent years, the elements, devices, modules, apparatus, or instruments for detecting the interactive gestures, postures or 3D scanning trajectories have been increasingly developed. Particularly, an infrared (IR) structured light may be employed to achieve the above detecting function, although the wavelength of IR band may be selected to be the less appeared in our environment. The structured light is generally developed with a finite cone of specific solid angle such that the interactive actions can be well recognized within the cone. On the other hand, a planar scanning structured light is also provided for recognizing the interactive actions or the important indicating objects. The structured pattern can be generated by diffractive element for a fixed pattern or projection device such that the pattern can be changed as required. Overall, to have better brightness contrast, the light of laser is considered. For a laser light emitter, the light is generally with a divergence angle, while for many application circumstances the light has to be collimated. As a result, a collimated infrared light is necessary to be achieved in advance for realizing the function. However, since the current laser diode module with the function of generating the collimated light has bulky volume, this laser diode module cannot meet the requirements of the modern slim type mobile phone, wearable devices, and so on.

On the other hand, the current laser diode module is usually equipped with a dust-proof lens at a side of a housing thereof. In some situations, the dust-proof lens may be omitted. However, if the dust-proof lens is omitted, the optical path length or the working distance is possibly changed. The change of the optical path length or the working distance may adversely affect the operation of the laser diode module. Therefore, it is important to install a compact-size and user-friendly structured light generation device in a mobile phone so as to achieve the 3D gesture or scanning function. Meanwhile, because of the volume of device becomes small, for the optical element its corresponding effective focal length (f), back focal length (bfl), and working distance (WD) have to be small, and then the tolerance becomes critical for such a compact-size device. In other words, the device has to be able to perform well enough for a range of values of working distance (or, effective focal length, or back focal length), not just a fixed value. When the design is workable for a range of parameters, so as to that with different of optical paths.

SUMMARY OF THE INVENTION

A structured light generation device is provided for achieving a sensing function in two dimensions (2D), 3D or 3D plus time variation, i.e., 4D. The structured light generation device uses a lens unit to generate at least two optical path lengths, so as to a range of parameters which could be crucial to achieve better performance with tolerance, and the flexibility of using the structured light generation device is enhanced.

A structured light generation device includes a lens unit with a lens element. The lens element has a first surface for collimating an invisible laser spot and a second surface for shaping the collimated invisible laser spot as a linear laser beam. Consequently, the parallel linear light beam is generated. A special mixed form structure is formed on the second surface of the lens element where the mixed form contains diffractive, reflective and/or refractive optical elements which are mixed spatially.

A structured light generation device includes a lens unit with a lens element. The lens element has an aspheric surface or a flat plane with a diffracting function for collimating an invisible laser spot and another plane with a lenticular lens array structure.

In accordance with an aspect of the present invention, a structured light generation device includes a laser diode, a lens unit and a housing. The laser diode emits an invisible laser spot. The lens unit converts the invisible laser spot into a linear laser beam. The housing is used for accommodating the laser diode and the lens unit. Within the housing, the lens unit constructs a first optical path length and a second optical path length for the invisible laser spot. The first optical path length and the second optical path length are different.

In an embodiment, the lens unit includes a lens element. A radius of a first surface of the lens element is larger than 0.189 mm. The first surface faces the laser diode and is an aspheric surface, or a first surface of the lens unit with a diffracting function faces to the laser diode and is a planar surface.

In an embodiment, a lenticular lens array structure is formed on a second surface of the lens element, wherein the second surface of the lens unit faces an outside of the housing.

In an embodiment, the lens unit further includes a dust-proof glass plate, which is arranged between the laser diode and the lens element. The lens element and the dust-proof glass plate are made of an identical material or different materials.

In an embodiment, the lens unit further comprises a mixed free form optical element which may contains diffractive, reflective and/or refractive structures, and the lens element is deposited between the laser diode and the mixed free form optical element.

In an embodiment, the first surface of the lens element with the diffracting function has a phase distribution given by a formula:

$$\phi(r) = dor\frac{2\pi}{\lambda_0}(df0 + df1r^2 + df2r^4 + df3r^6 + df4r^8 + ...)$$

where, $r^2=x^2+y^2$, wherein $\phi(r)$ is the phase distribution, r is the distance between a point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), df6=3.1385×10^(−4), and the lens element with the aspheric surface has an effective focal length smaller than 1.2 mm. The corresponding numerical aperture (NA) is larger than 0.1 and less than 0.5.

In an embodiment, the lens unit includes a lens element, and the lens element includes a first surface and a second surface. The invisible laser spot is collimated by the first surface of the lens element, and the collimated invisible laser spot is converted into the linear laser beam by the second surface of the lens element.

In an embodiment, the lens unit further includes a dust-proof glass plate between the laser diode and the lens element. The lens element and the dust-proof glass plate are made of an identical material or different materials. The material of the lens element is a transparent material selected from poly (methyl methacrylate), polycarbonate or cyclo-olefin polymer.

In an embodiment, the first surface of the lens element has an aspheric surface, and a surface profile of the aspheric surface is given by a following formula:

$$z = \frac{cvr^2}{1+\sqrt{1-cv^2(cc+1)r^2}} + as0 + as1r^2 + as2r^4 + as3r^6 + as4r^8 + as5r^{10} + as6r^{12} + \ldots$$

wherein z is the Z-axis coordinate of a specified point on the aspheric surface from a vertex, CV is a radius of curvature, CC is a conic coefficient, $as0=as1=0.0$, $as2=9.6037\times10^1$, $as3=-4.1955\times10^3$, $as4=-2.5357\times10^4$, $as5=-7.2472\times10^1$, and $as6=-3.0699$.

In an embodiment, the first surface of the lens element is a flat surface with a diffracting function, and the first surface has a phase distribution given by a formula:

$$\phi(r) = dor\frac{2\pi}{\lambda_0}(df0 + df1r^2 + df2r^4 + df3r^6 + df4r^8 + \ldots)$$

where, $r^2=x^2+y^2$, wherein $\phi(r)$ is the phase distribution, r is the distance between a point and a center of the first surface, and x and y are two coordinates of two axes vertical to an optical axis or a Z axis, wherein $dor=1$, $df0=0.0$, $df1=-6.1691\times10^{\wedge}(-1)$, $df2=2.8442\times10^{\wedge}1$, $df3=-4.8405\times10^{\wedge}3$, $df4=2.800\times10^{\wedge}5$, $df5=4.6892\times10^{\wedge}(-2)$, and $df6=3.1385\times10^{\wedge}(-4)$.

In an embodiment, a numerical aperture corresponding to the lens element is larger than 0.1 and less than 0.5.

In an embodiment, a lenticular lens array structure is formed on the second surface of the lens element.

In an embodiment, the second surface of the lens element is flat and a special mixed form structure is formed on the second surface of the lens element where the mixed form contains diffractive, reflective and/or refractive optical elements which are mixed spatially.

In an embodiment, the first optical path length or a second optical path length includes one or plural working distances, wherein a difference between the plural working distances is smaller than 1.2 mm.

In an embodiment, the laser diode includes one or more semiconductor chips.

In an embodiment, the laser diode is not limited to TO CAN packaging. Surface mount device (SMD) type is workable.

In an embodiment, the invisible laser spot is an infrared laser spot.

In accordance with another aspect of the present invention, there is provided a structured light generation device. The structured light generation device includes a laser diode, a lens unit and a housing. The laser diode emits an invisible laser spot. The lens unit converts the invisible laser spot into a linear laser beam or the other types of light pattern. The housing is used for accommodating the laser diode and the lens unit. The housing includes a first side and a second side. The first side and the second side are opposed to each other and open to an outside of the casing. A distance between the first side and the second side is not larger than 4 mm. The laser diode is located near the first side. The lens unit is located near the second side. Within the housing, the lens unit constructs a first optical path length and a second optical path length for the invisible laser spot, and the first optical path length and the second optical path length are different.

In an embodiment, the lens unit includes a lens element. A radius of a first surface of the lens element is larger than 0.189 mm. The first surface faces the laser diode and is an aspheric surface, wherein the lens element with the aspheric surface has an effective focal length smaller than 1.2 mm.

In an embodiment, a lenticular lens array structure is formed on a second surface of the lens element. The second surface of the lens unit is close to the second side of the housing and faces the outside of the housing.

In an embodiment, a complex mixed structure form is formed on a second surface of the lens element where the mixed form contains diffractive, reflective and/or refractive optical elements with symmetrical or asymmetrical free form on the surface.

In an embodiment, the lens unit further includes a dust-proof glass plate, which is arranged between the laser diode and the lens element.

In an embodiment, a first surface of the lens element is a flat surface with a diffracting function, and the first surface has a phase distribution given by a formula:

$$\phi(r) = dor\frac{2\pi}{\lambda_0}(df0 + df1r^2 + df2r^4 + df3r^6 + df4r^8 + \ldots)$$

where, $r^2=x^2+y^2$, wherein $\phi(r)$ is the phase distribution, r is the distance between a point and a center of the first surface, and x and y are two coordinates of two axes vertical to an optical axis or a Z axis, wherein $dor=1$, $df0=0.0$, $df1=-6.1691\times10^{\wedge}(-1)$, $df2=2.8442\times10^{\wedge}1$, $df3=-4.8405\times10^{\wedge}3$, $df4=2.800\times10^{\wedge}5$, $df5=4.6892\times10^{\wedge}(-2)$, and $df6=3.1385\times10^{\wedge}(-4)$.

In an embodiment, a lenticular lens array structure is formed on a second surface of the lens element, wherein the second surface of the lens unit is close to the second side of the housing and faces the outside of the housing.

In an embodiment, a mixed free form optical element structure is formed on a second surface of the lens element, wherein the second surface of the lens unit is close to the second side of the housing and faces the outside of the housing. The mixed free form optical element is in a surface form which may contains diffractive, reflective and/or the refractive structures simultaneously and effectively.

In an embodiment, the laser diode includes one semiconductor chip or plural semiconductor chips on different positions of a substrate.

In an embodiment, semiconductor chips are packaged in a form of CAN package structure, a DIP package structure, a QFP package structure or a surface mount device.

From the above descriptions, the present invention provides a structured light generation device with a lens unit. The lens unit is installed in a compact housing of the structured light generation device for generating two different optical path lengths. Consequently, because two different optical paths also happens to the cases that effective focal length (back focal length, or working distance) are different, the lens unit is also applicable to the case where a range of parameters is considered, i.e., with larger tolerance to the sensitivity of parameters. By the lens unit, an infrared laser spot is collimated into a linear infrared laser beam. Consequently, the infrared laser spot is shaped into a structured light for detection.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
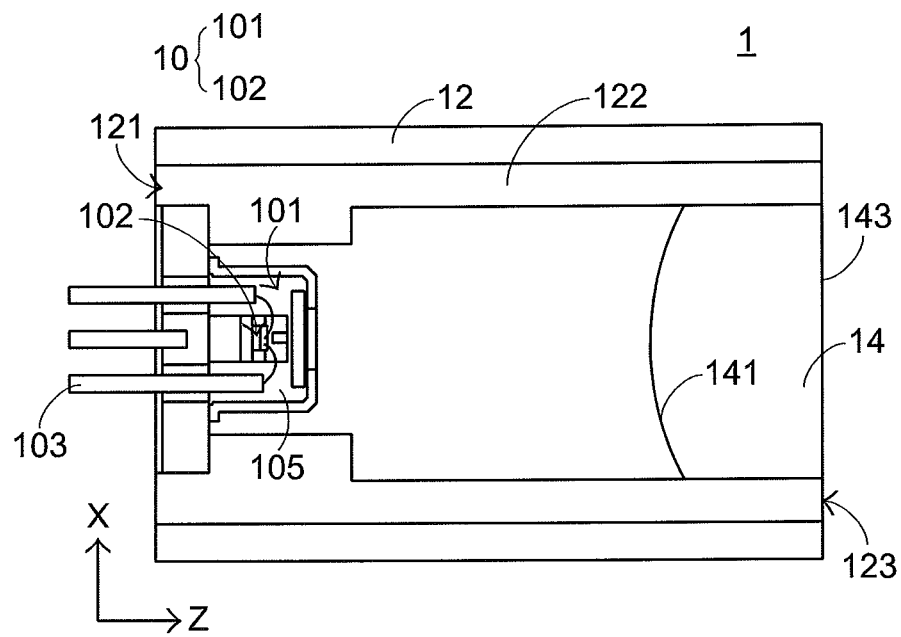
FIG. 1 is a schematic cross-sectional side view illustrating a structured light generation device according to a first embodiment of the present invention.

FIG. 1 is a schematic cross-sectional side view illustrating a structured light generation device according to a first embodiment of the present invention. As shown in FIG. 1, the structured light generation device 1 includes a laser diode (LD) 10, a housing 12 and a lens unit 14. The housing 12 may provide an accommodation space for accommodating the laser diode 10 and the lens unit 14. Generally, the housing 12 is opaque. The housing 12 includes a first side 121, a second side 123 and a fixing structure 122. The first side 121 and the second side 123 are opposed to each other. The fixing structure 122 is disposed within the housing 12. In this embodiment, the fixing structure 122 is used for fixing the laser diode 10 at the first side 121 and fixing the lens unit 14 at the second side 123. It is noted that the functions of the fixing structure 122 are not restricted. The fixing structure 122 may be a one-piece structure or an assembled structure. Moreover, the fixing structure 122 may be installed within the housing 12 or directly integrated with the housing 12. Moreover, the housing has a compact size on the consideration of the structured light generation device 1 of the present invention suitably applied to a camera phone. For example, each of the first side 121 and the second side 123 has a dimension of 4~6 mm×6 mm, and the distance between the first side 121 and the second side 123 is about 2.5~7 mm, and preferably 4.0 mm, but not restricted aforementioned in the present invention. Moreover, the shapes of the first side 121 and the second side 123 are not restricted to the above square shapes.

The laser diode 10 includes one or more semiconductor chips 102 and a package structure 101. The semiconductor chip 102 may emit an infrared laser light with a wavelength of 830 nm, for example, and a diffusion angle of about 20 degrees, and be packaged by the package structure 101. The number of the one or more semiconductor chips 102 packaged within the package structure 101 is not restricted. In an embodiment, twelve semiconductor chips 102 are firstly distributed on different positions of a substrate and then covered by the package structure 101. For clarification and brevity, only a single semiconductor chip 102 is shown in FIG. 1. An example of the package structure 101 includes but is not limited to a CAN package structure, a DIP package structure, a QFP package structure or a surface mount device. Basically, the package structure 101 includes a main body 105 and one or plural pins 103. The one or plural pins 103 are protruded out of the main body 105 or disposed on a surface of the main body 105. As shown in FIG. 1, the pins 103 are protruded out of the housing 12 in a direction vertical to the first side 121.

The thickness of the main body 105 in the direction vertical to the first side 121 is approximately not larger than 1 mm. It is noted that the thickness of the main body 105 is not restricted. Moreover, the laser diode 10 may generate an emitting pattern of symmetrical circular light spots or asymmetrical elliptic light spots. In other words, the lens unit 14 of the present invention can be applied to the laser diode 10 that generates the symmetric or asymmetric emitting pattern.

In this embodiment, the lens unit 14 includes a lens element with a numerical aperture larger than 0.1 and less than 0.5, preferably of about 0.2. The lens element includes a first surface 141 and a second surface 143. The first surface 141 is a curvy surface with a curvature of radius larger than 0.189 mm. The second surface 143 has another optical structure. The first surface 141 faces the laser diode 10 (or the first side 121 of the housing 12), and the second surface 143 faces the second side 123 of the housing 12. The distance between the first surface 141 of the lens element and the laser diode 10 is about 1.00 mm. The laser diode 10 may emit an invisible laser spot. The lens unit 14 constructs a first optical path length for the invisible laser spot. Moreover, the first surface 141 of the lens element is an aspheric surface for collimating the invisible laser spot from the laser diode 10. Preferably, the radius of the first surface 141 is in the range between 0.18935 and 0.1894 mm. The surface profile of the aspheric surface may be expressed by the Z-axis coordinate of a specified point on the aspheric surface. The Z axis is in parallel with the optical axis. In particular, the surface profile of the aspheric surface may be given by the following formula:

$$z = \frac{cvr^2}{1+\sqrt{1-cv^2(cc+1)r^2}} + as0 + as1r^2 + as2r^4 + as3r^6 + as4r^8 + as5r^{10} + as6r^{12} + \ldots$$

In the above formula, z is the Z-axis coordinate of a specified point on the aspheric surface from the vertex, CV is the radius of curvature, CC is the conic coefficient, (asn) indicate the aspheric coefficients corresponding to different order terms of radius, wherein n indicates 0 or a positive integer. For example, as0=as1=0.0, as2=9 0.6037×10^1, as3=−4.1955× 10^3, as4=−2.5357×10^4, as5=−7.2472×10^1, and as6=− 3.0699. It is noted that the aspheric coefficients are not limited thereto. Moreover, the effective focal length of the lens element is preferably smaller than 1.2 mm, and more preferably smaller than 1.0 mm. The lens element is made of poly(methyl methacrylate) (PMMA) or any other appropriate transparent material such as polycarbonate (PC) or cyclo-olefin polymer (COP resin).

In this embodiment, after the collimated invisible laser spot is converted into a linear laser beam by the second surface 143 of the lens element, a structured light is outputted from the structured light generation device 1. In this embodiment, the invisible laser spot may be converted to be in a pattern with a free-form type. More especially, a lenticular lens array structure (not shown) may be formed on the second surface 143, wherein the curvature of the lenticular lens array structure is −64 degrees in the X-axis direction vertical to optical axis. Preferably, the overall thickness of the lens element is not larger than 1.2 mm. Consequently, the thickness of the housing in the Z-axis direction or the optical axis direction is not larger than 4 mm. Under this circumstance, the structured light generation device 1 can meet the requirement of slimness.

Furthermore, a mixed free form optical element structure may be formed on the second surface 143 of the lens element. The mixed free form optical element is in a surface form which may contains diffractive, reflective and/or the refractive structures simultaneously and effectively.

Figure 2:
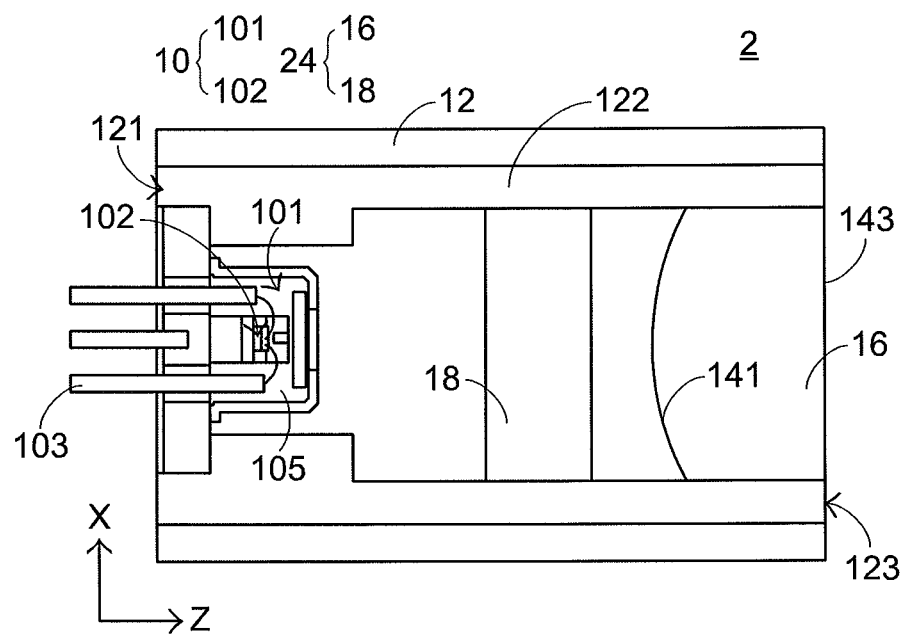
FIG. 2 is a schematic cross-sectional side view illustrating a structured light generation device according to a second embodiment of the present invention.

FIG. 2 is a schematic cross-sectional side view illustrating a structured light generation device according to a second embodiment of the present invention. As shown in FIG. 2, the lens unit 24 of the structured light generation device 2 includes a lens element 16 and a dust-proof glass plate 18. The lens element 16 of this embodiment is equivalent to the lens unit 14 of the first embodiment. That is, in comparison with the first embodiment, the dust-proof glass plate 18 is additionally installed in the housing 12 of the structured light generation device 2 of this embodiment. Generally, the commercially available laser diode module is equipped with a dust-proof glass plate to prevent external dust or foreign matter from entering the laser diode module. In other words, the arrangement of the dust-proof glass plate 18 also has the function of blocking the external dust or foreign matter. In an embodiment, the dust-proof glass plate 18 is made of a BK7 material, the thickness of the dust-proof glass plate 18 is about 0.25 mm, and the distance of the dust-proof glass plate 18 from the laser diode 10 is about 0.5 mm. It is noted that the material, thickness and distance of the dust-proof glass plate 18 are not restricted. In another embodiment, the dust-proof glass plate 18 is made of the same material as the lens element 16. Moreover, the dust-proof glass plate 18 is arranged between the laser diode 10 and the lens element 16. That is, the dust-proof glass plate 18 is arranged in the range of the first optical path length. The lens unit 24 constructs a second optical path length for the invisible laser spot from the laser diode 10. Since the refraction index of the dust-proof glass plate 18 is different from that of air, the second optical path length is different from the first optical path length. The object of the lens element is not relevant to the imaging purpose of the general optical imaging device. That is, although the arrangement of the dust-proof glass plate or any other appropriate medium can generate the different optical path length, the lens element of this embodiment is suitably to generate two different optical path lengths. After the invisible laser spot is converted into a linear laser beam by the lens element, a structured light is outputted from the structured light generation device 2. Consequently, the invisible laser beam is effectively shaped. Generally, the optical path length is the product of a working distance of the light and the refraction index of the medium. In accordance with the present invention, the difference between the working distances of the two or more optical path lengths is preferably smaller than 1 mm.

Figure 3:
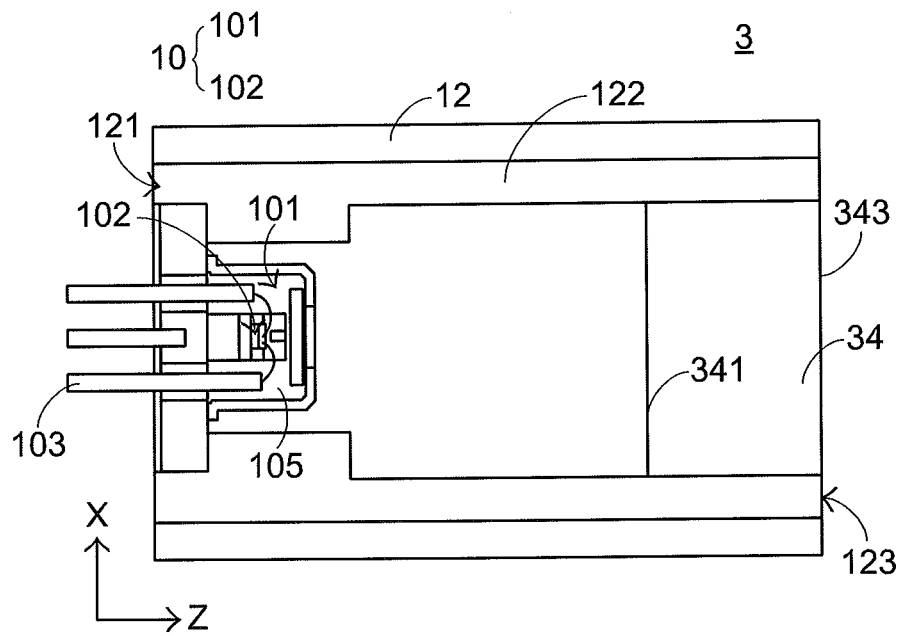
FIG. 3 is a schematic cross-sectional side view illustrating a structured light generation device according to a third embodiment of the present invention.

FIG. 3 is a schematic cross-sectional side view illustrating a structured light generation device according to a third embodiment of the present invention. Similarly, the lens unit 34 of the structured light generation device 3 of this embodiment has the first surface 341 facing the laser diode 10. In comparison with the structured light generation device of the first embodiment as shown in FIG. 1, the first surface 341 of the lens unit 34 of this embodiment is a flat surface with a diffracting function. Like the second surface 143 of the lens unit 14 of the first embodiment, a lenticular lens array structure is formed on the second surface 343 of the lens unit 34. The lens unit 34 is also capable of generating a first optical path length. In this embodiment, the first surface 341 with the diffracting function has a phase distribution given by the following formula:

$$\phi(r) = dor \frac{2\pi}{\lambda_0}(df0 + df1r^2 + df2r^4 + df3r^6 + df4r^8 + \ldots)$$

where, $r^2 = x^2 + y^2$.

In the above formula, $\phi(r)$ is the phase distribution, r is the distance between a point and a center of the first surface, and x and y are two coordinates of two axes vertical to the optical axis (i.e. the Z axis). Preferably, the corresponding coefficients include: dor=1, df0=0.0, df1=−6.1691×10^(−1), df2=2.8442×10^1, df3=−4.8405×10^3, df4=2.800×10^5, df5=4.6892×10^(−2), and df6=3.1385×10^(−4).

Figure 4:
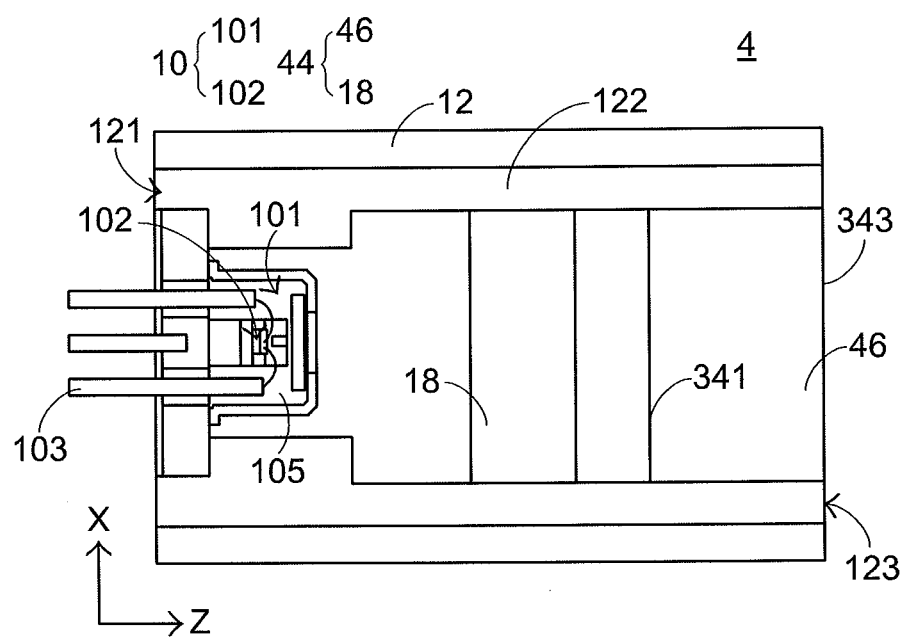
FIG. 4 is a schematic cross-sectional side view illustrating a structured light generation device according to a fourth embodiment of the present invention.

FIG. 4 is a schematic cross-sectional side view illustrating a structured light generation device according to a fourth embodiment of the present invention. As shown in FIG. 4, the lens unit 44 of the structured light generation device 4 includes a lens element 46 and a dust-proof glass plate 18. The dust-proof glass plate 18 is similar to that of the second embodiment. In comparison with the structured light generation device of the third embodiment as shown in FIG. 3, the dust-proof glass plate 18 is arranged between the laser diode 10 and the lens element 46 of the lens unit 44. The lens element 46 of the structured light generation device 4 of this embodiment is equivalent to the lens unit 34 of the third embodiment. As mentioned above, by the arrangement of the lens unit 44 (or the lens element 46), the structured light generation device is suitably to generate two different optical path lengths. Moreover, the concepts of the present invention is applied to the situation where the laser diode 10 has plural semiconductor chips to result in different work distances as long as the difference between any two working distances is smaller than 1.2 mm.

From the above descriptions, the present invention provides the structured light generation device. In the structured light generation device, the lens element with the functions of simultaneously collimating and shaping the light beam is used as the basic element of the lens unit. Consequently, the structured light generation device may be applied to an optical system with at least two optical path lengths in order to generate the infrared structured light. The optical path length is composed of one or plural working distances. The plural working distances may be identical or different as long as the difference between the working distances is smaller than 1.0 mm. In other words, the optical system with the structured light generation device of the present invention is more flexible to be conveniently operated by the user. Since the structured light generation device of the present invention has a compact size, the structured light generation device is suitably installed in the slim type mobile phone. Consequently, regardless of whether the structured light generation device is installed on a front side or a rear side of the mobile phone, the mobile phone has the function of generating the structured light.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A structured light generation device, comprising:
a laser diode emitting an invisible laser spot;

a lens unit converting the invisible laser spot into a linear laser beam; and a housing accommodating the laser diode and the lens unit, wherein within the housing, the lens unit constructs a first optical path length and a second optical path length for the invisible laser spot, and the first optical path length and the second optical path length are different, wherein the lens unit comprises a lens element, wherein a radius of a first surface of the lens element is larger than 0.189 mm, wherein the first surface faces the laser diode and is an aspheric surface, or a first surface of the lens unit with a diffracting function faces to the laser diode and is a planar surface.

2. The structured light generation device according to claim 1, wherein a lenticular lens array structure is formed on a second surface of the lens element, wherein the second surface of the lens unit faces an outside of the housing.

3. The structured light generation device according to claim 2, wherein the lens unit further comprises a dust-proof glass plate arranged between the laser diode and the lens element, and the lens element and the dust-proof glass plate are made of an identical material or different materials.

4. The structured light generation device according to claim 2, wherein the lens unit further comprises a mixed free form optical element which may contains diffractive, reflective and/or refractive structures, and the lens element is deposited between the laser diode and the mixed free form optical element.

5. The structured light generation device according to claim 1, wherein the first surface of the lens element with the diffracting function has a phase distribution given by a formula:

$$\phi(r) = dor\frac{2\pi}{\lambda_0}(df0 + df1r^2 + df2r^4 + df3r^6 + df4r^8 + ...)$$

where, r2=x2+y2, wherein φ(r) is the phase distribution, r is the distance between a point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), df6=3.1385×10^(−4), and the lens element with the aspheric surface has an effective focal length smaller than 1.2 mm.

6. The structured light generation device according to claim 5, wherein a numerical aperture corresponding to the lens element is larger than 0.1 and less than 0.5.

7. The structured light generation device according to claim 1, wherein the lens element further comprises a second surface facing an outside of the housing, and a mixed form structure is formed on the second surface of the lens element, and wherein the mixed form structure contains a diffractive, reflective and/or refractive optical elements mixed spatially.

8. The structured light generation device according to claim 1, wherein the lens element has a second surface, the invisible laser spot is collimated by the first surface of the lens element, and the collimated invisible laser spot is converted into the linear laser beam by the second surface of the lens element.

9. The structured light generation device according to claim 8, wherein the lens unit further comprises a dust-proof glass plate between the laser diode and the lens element, wherein the lens element and the dust-proof glass plate are made of an identical material or different materials, wherein the material of the lens element is a transparent material selected from poly(methyl methacrylate), polycarbonate or cyclo-olefin polymer.

10. The structured light generation device according to claim 8, wherein the first surface of the lens element has an aspheric surface, and a surface profile of the aspheric surface is given by a following formula:

$$z = \frac{cvr^2}{1 + \sqrt{1 - cv^2(cc+1)r^2}} + as0 + as1r^2 + as2r^4 + as3r^6 + as4r^8 + as5r^{10} + as6r^{12} + ...$$

wherein z is the Z-axis coordinate of a specified point on the aspheric surface from a vertex, CV is a radius of curvature, CC is a conic coefficient, as0=as1=0.0, as2=9.6037×10^1, as3=−4.1955×10^3, as4=−2.5357×10^4, as5=−7.2472×10^1, and as6=−3.0699.

11. The structured light generation device according to claim 8, wherein the first surface of the lens element is a flat surface with a diffracting function, and the first surface has a phase distribution given by a formula:

$$\phi(r) = dor\frac{2\pi}{\lambda_0}(df0 + df1r^2 + df2r^4 + df3r^6 + df4r^8 + ...)$$

where, r2=x2+y2,
wherein φ(r) is the phase distribution, r is the distance between a point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), and df6=3.1385×10^(−4).

12. The structured light generation device according to claim 11, wherein a numerical aperture corresponding to the lens element is larger than 0.1 and less than 0.5.

13. The structured light generation device according to claim 8, wherein a lenticular lens array structure is formed on the second surface of the lens element.

14. The structured light generation device according to claim 8, wherein the second surface of the lens element is flat, and a mixed form structure is formed on the second surface of the lens element, and wherein the mixed form structure contains a diffractive, reflective and/or refractive optical elements mixed spatially.

15. The structured light generation device according to claim 8, wherein the first optical path length or the second optical path length comprises one or plural working distances, wherein a difference between the plural working distances is smaller than 1.2 mm.

16. The structured light generation device according to claim 1, wherein the laser diode comprises one or more semiconductor chips.

17. The structured light generation device according to claim 16, wherein the semiconductor chips are packaged in a form of CAN package structure, a DIP package structure, a QFP package structure or a surface mount device.

18. The structured light generation device according to claim 1, wherein the invisible laser spot is an infrared laser spot.

19. A structured light generation device, comprising:
a laser diode emitting an invisible laser spot;
a lens unit converting the invisible laser spot into a linear laser beam; and a housing accommodating the laser diode and the lens unit, wherein the housing comprises a first side and a second side, wherein the first side and the second side are opposed to each other and open to an outside of the casing, a distance between the first side and the second side is not larger than 4 mm, the laser diode is located near the first side, and the lens unit is located near the second side, wherein within the housing, the lens unit constructs a first optical path length and a second optical path length for the invisible laser spot, and the first optical path length and the second optical path length are different.

20. The structured light generation device according to claim 19, wherein the lens unit comprises a lens element, wherein a radius of a first surface of the lens element is larger than 0.189 mm, wherein the first surface faces the laser diode and is an aspheric surface, wherein the lens element with the aspheric surface has an effective focal length smaller than 1.2 mm.

21. The structured light generation device according to claim 19, wherein a lenticular lens array structure is formed on a second surface of the lens element, and the second surface of the lens unit is close to the second side of the housing and faces the outside of the housing.

22. The structured light generation device according to claim 19, wherein the lens unit further comprises a dust-proof glass plate, which is arranged between the laser diode and the lens element.

23. The structured light generation device according to claim 19, wherein a first surface of the lens element is a flat surface with a diffracting function, and the first surface has a phase distribution given by a formula:

$$\phi(r) = dor\frac{2\pi}{\lambda_0}(df0 + df1r^2 + df2r^4 + df3r^6 + df4r^8 + \ldots)$$

where, r2=x2+y2, wherein $\phi(r)$ is the phase distribution, r is the distance between a point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), and df6=3.1385×10^(−4).

24. The structured light generation device according to claim 23, wherein a lenticular lens array structure is formed on a second surface of the lens element, wherein the second surface of the lens unit is close to the second side of the housing and faces the outside of the housing.

25. The structured light generation device according to claim 19, wherein the laser diode comprises one semiconductor chip or plural semiconductor chips on different positions of a substrate.

\* \* \* \* \*